United States Patent [19]
Kerber

[11] Patent Number: 5,976,932
[45] Date of Patent: *Nov. 2, 1999

[54] MEMORY CELL AND METHOD FOR PRODUCING THE MEMORY CELL

[75] Inventor: Martin Kerber, München, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/884,770

[22] Filed: Jun. 30, 1997

[30] Foreign Application Priority Data

Jun. 28, 1996 [DE] Germany .............. 196 26 089

[51] Int. Cl.⁶ .................................. H01L 21/266
[52] U.S. Cl. ........................... 438/257; 438/265
[58] Field of Search .................... 257/314, 315, 257/316, 321, 322; 438/264, 258, 594, 257, 265

[56] References Cited

U.S. PATENT DOCUMENTS

| | | | |
|---|---|---|---|
| 3,868,187 | 2/1975 | Masuoka | 257/322 |
| 4,004,159 | 1/1977 | Rai et al. | 257/316 |
| 4,161,039 | 7/1979 | Rossler | 257/316 |
| 4,420,871 | 12/1983 | Sheibe | 257/316 |
| 4,852,062 | 7/1989 | Baker et al. | 365/185 |
| 5,256,584 | 10/1993 | Hartmann | 437/43 |
| 5,506,432 | 4/1996 | Kurusu . | |

FOREIGN PATENT DOCUMENTS 0 123 249 A2  10/1984  European Pat. Off. .
0 591 598 A1   4/1994  European Pat. Off. .

OTHER PUBLICATIONS

Patent Abstracts of Japan (Noda Masanori), dated Mar. 12, 1990, vol. 14, No. 252.
Patent Abstracts of Japan (Yamamoto Hideaki), dated Jan. 9, 1990, vol. 14, No. 139.
Patent Abstracts of Japan (Kitagawa Norio), dated Sep. 2, 1994, vol. 18, No. 629.
Patent Abstracts of Japan (Yamaguchi Takao), dated Oct. 6, 1982, vol. 7, No. 4.

*Primary Examiner*—Sara Crane
*Attorney, Agent, or Firm*—Herbert L. Lerner; Laurence A. Greenberg

[57] ABSTRACT

A memory cell and a method for producing the memory cell have a plurality of structured layers disposed on a semiconducting base body and an exactly defined overlap region of a first doped region and a floating gate layer. A control gate layer is disposed approximately without any overlap over the first doped region. The memory cell can be programmed with the aid of the Fowler-Nordheim tunnel effect.

5 Claims, 3 Drawing Sheets

MEMORY CELL AND METHOD FOR PRODUCING THE MEMORY CELL

BACKGROUND OF THE INVENTION

FIELD OF THE INVENTION

The invention relates to a memory cell having the following features:

a semiconducting base body with a first main surface, a first doped region of a first conduction type on the first main surface, the first doped region connected to a drain terminal, a second doped region of the first conduction type on the first main surface, the second doped region connected to a source terminal, a floating gate layer disposed on the first main surface, having an oxide layer underneath it, covering a region between the first and second doped regions and partially covering at least one of the two doped regions, and a control gate layer disposed on the floating gate layer, having a dielectric underneath it and connected to a control gate terminal. The invention also relates to a method for producing the memory cell.

Such a memory cell is disclosed, for example, in the book entitled "Lehrbuch der Hochfrequenztechnik" [Textbook of Radio-Frequency Technology] by Meinke and Gundlach, Springer, 5th Edition, 1992, page M 40 et seq. In memory cells of that type, the flow of current between the two doped regions, which are respectively connected to the gate terminal and the source terminal, is critically influenced by a charge situated in the floating gate layer.

The floating gate layer can be charged and/or discharged, utilizing the Fowler-Nordheim tunnel effect, for example, by the flow of a tunneling current between the floating gate layer and one of the two doped regions. Following conventions in the literature, it is assumed in the following text that the first doped region, which is connected to the drain terminal and is frequently also referred to as the drain region, is the doped region from which the tunneling current commences toward the floating gate, but that does not preclude the possibility of a tunneling current also flowing between the floating gate layer and the second doped region, which is connected to the source terminal, instead of the drain region.

The commencement of a tunneling current between the floating gate layer and the drain region necessitates not only the application of a sufficiently high voltage between the control gate terminal and the drain terminal but also overlapping of the floating gate layer over the drain region. In that case, the level of the voltage to be applied, which is also referred to as the programming voltage, and the required duration for charging the floating gate layer from a lower potential, to an upper potential, and discharging it from an upper potential to a lower potential, which is also referred to as the programming time, are sensitively dependent on the overlap region.

In the case of previous memory cells, a common structure edge of the control gate layer and the floating gate layer, which is also referred to as the gate edge, is usually provided over the drain region, that is to say the control gate layer and the floating gate layer cover the drain region to the same extent. For that reason, during the process of producing such memory cells, on the first main surface of the base body, the drain region can be doped into the first main surface only as far as the gate edge, with the result that an overlap region of the floating gate layer and drain region does not yet exist. The overlap region is produced from subsequent thermal diffusion of the drain region under the floating gate layer, with that overlap region being restricted, inter alia, by three circumstances:

1. For various reasons, the drain region may not be doped as far as the gate edge, which results in a smaller overlap region during the subsequent diffusion.

2. In the course of oxidations which follow during production, a thicker oxide layer, a so-called bird's beak, is formed on the gate edge, as a result of which the tunneling current density is exponentially reduced.

3. The dopant concentration greatly decreases in the lateral direction, with the result that efficient tunneling of the charge carriers can only take place at the gate edge.

Overall, then, small process fluctuations during the production of the memory cells described to date can lead to a large variation in the programming voltage and programming time, since that region of the overlap region of the drain region and the floating gate layer which is critical for tunneling is given by the difference between the length of the bird's beak and the length of the doped region which is diffused under the floating gate layer, and cannot be exactly defined.

SUMMARY OF THE INVENTION

It is accordingly an object of the invention to provide a memory cell and a method for producing the memory cell, which overcome the hereinafore-mentioned disadvantages of the heretofore-known devices and methods of this general type in such a way that an exactly defined programming voltage or programming time is produced.

With the foregoing and other objects in view there is provided, in accordance with the invention, a memory cell, comprising a semiconducting base body having a first main surface; a first doped region of a first conduction type on the first main surface; a drain terminal connected to the first doped region; a second doped region of the first conduction type on the first main surface, defining a given region between the first and second doped regions; a source terminal connected to the second doped region; an oxide layer disposed on the main surface; a floating gate layer disposed on the oxide layer, covering the given region, having at least one first partial region overlapping at least one of the first and second doped regions, and having first and second structure edges defining a given distance therebetween; a dielectric disposed on the floating gate layer; a control gate layer disposed on the dielectric, having first and second structure edges defining a distance therebetween less than the given distance, and having at least one second partial region overlapping at least one of the first and second doped regions, the at least one second partial region being smaller than the at least one first partial region; and a control gate terminal connected to the floating gate layer.

In the case of a memory cell having the structure described, it is possible, in a simple manner, to exactly define that region of the overlap region of the drain region and the floating gate layer which is critical for tunneling and, consequently, to exactly define the programming voltage and programming time. That region of the overlap region of the drain region and the floating gate layer which is critical for tunneling corresponds to the overlap region of the drain region and the floating gate layer in memory cells having the structure specified.

During the method for producing the memory cell, the structure described permits the selection of the size of the overlap region of the floating gate layer and the drain region in accordance with the size of that region of the floating gate layer which is not overlapped by the control gate layer.

In accordance with another feature of the invention, the control gate layer is disposed over both of the doped regions defining two of the second partial regions of the control gate layer being smaller than the at least one first partial region or two first partial regions of the floating gate layer.

In accordance with again another feature of the invention, the control gate layer is disposed without overlap over at least one of the two doped regions.

In accordance with still another feature of the invention, the floating gate layer partially overlaps the first and second doped regions, and the control gate layer is disposed without overlap over the two doped regions.

Assuming that the charge carriers tunnel from the first doped region, in other words the drain region, to the floating gate layer, overlapping of the floating gate layer over the second doped region is not necessary. A development of the invention provides overlapping of the floating gate layer over the second doped region, with the control gate layer overlapping the second doped region to a lesser extent than the floating gate layer.

In accordance with a further feature of the invention, the two doped regions of the first conduction type are n-conducting, while according to an added feature, the two doped regions ate p-conducting.

In accordance with an additional feature of the invention, the semiconducting base body is constructed in silicon, which affords the advantage of a well-controllable method for producing the memory cell, while in accordance with yet another feature the semiconducting base body constructed in gallium arsenide promises a higher integration level.

In accordance with yet a further feature of the invention, in both cases, the floating gate layer is composed of the corresponding semiconductor material, that is to say silicon or gallium arsenide, while in accordance with yet an added feature the semiconducting base body is composed of silicon and the floating gate layer is also composed of silicon nitride.

In accordance with yet an additional feature of the invention, the floating gate layer is composed of metal nitrides or metal silicides.

With the objects of the invention in view, there is also provided a method for producing a memory cell, which comprises applying an oxide layer on a main surface of a semiconducting base body; applying a floating gate layer on the oxide layer; applying a dielectric on the floating gate layer; applying a control gate layer on the dielectric defining edges of the control gate layer and defining a region of the main surface not covered by the control gate layer; applying a covering layer on the control gate layer; doping two doped regions of a first conduction type into the semiconducting base body using a photomask; removing the photomask; producing two spacers each on a respective one of the edges of the control gate layer; removing the spacer on one of the edges of the control gate layer leaving a remaining spacer and defining a region of the main surface not covered by the remaining spacer; removing the dielectric and the floating gate layer from the regions of the main surface not covered by the control gate layer and not covered by the remaining spacer; and removing the remaining spacer.

In accordance with another mode of the invention, there is provided a method which comprises removing both of the spacers after the step of producing the two spacers.

In accordance with a concomitant mode of the invention, there is provided a method which comprises omitting the step of applying the covering layer.

Other features which are considered as characteristic for the invention are set forth in the appended claims.

Although the invention is illustrated and described herein as embodied in a memory cell and a method for producing the memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
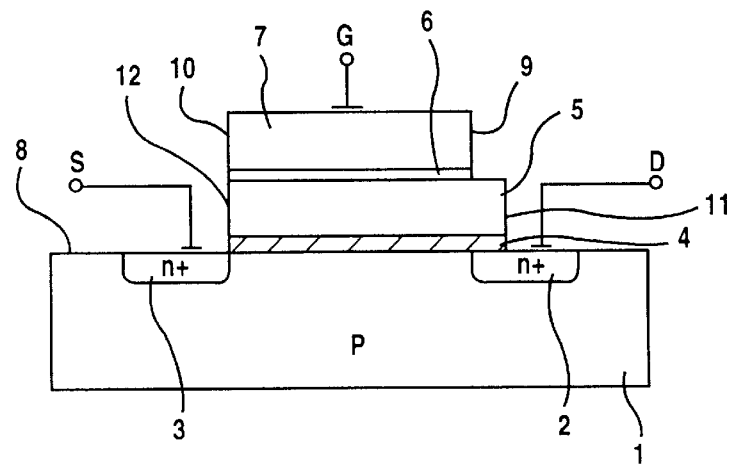
FIG. 1 is a diagrammatic, cross-sectional view of a first exemplary embodiment of a memory cell according to the invention.

Referring now in detail to the figures of the drawings, in which identical reference symbols designate identical parts having the same meaning, unless indicated otherwise, and first, particularly, to FIG. 1 thereof, there is seen a cross-section through a first exemplary embodiment of a memory cell according to the invention. In the illustrated exemplary embodiment, a floating gate layer 5, which has an oxide layer 4 laid underneath it, has a first structure edge 11 which partially overlaps a first doped region 2. The first doped region 2 is doped in the form of a well into a main surface 8 of a semiconducting base body 1. A second doped region 3 is also in the form of a well. An overlap region of the first doped region 2 and the floating gate layer 5 is bounded in the direction of the second doped region 3 by a plane containing a first structure edge 9 of a control gate layer 7. The control gate layer 7 consequently does not overlap the first doped region 2.

In the illustrated embodiment, neither the floating gate layer 5 nor the control gate layer 7, which is separated from the floating gate layer 5 by a dielectric 6, overlap the second doped region 3. In this case, a second structure edge 10 of the control gate layer 7 and a second structure edge 12 of the floating gate layer 5 lie in a plane which would bound the second doped region 3 if the plane were imaginarily lengthened in the direction of the semiconductor body. In the example illustrated in FIG. 1, the two doped regions 2, 3 are assumed to be n-doped, while the semiconducting base body 1 is assumed to be p-doped. However, it is likewise possible to dope the two doped regions 2, 3 in such a way that they are p-conducting and to dope the semiconducting base body in such a way that it is n-conducting.

It would likewise be conceivable to construct the semiconducting base body 1 and the two doped regions 2, 3 as regions of the same conduction type, but it would then be necessary to provide a well of the complementary conduction type around the two doped regions 2, 3 and between the two doped regions 2, 3.

Figure 2:
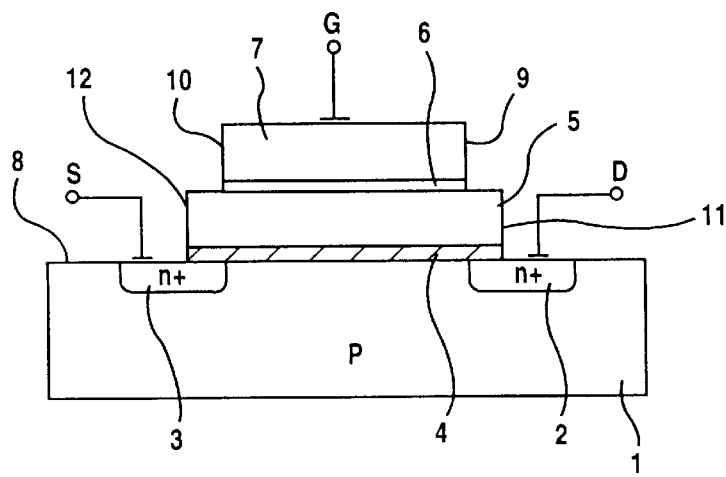
FIG. 2 is a cross-sectional view of a second exemplary embodiment of a memory cell.

FIG. 2 illustrates a second example of a memory cell according to the invention. In the illustrated exemplary embodiment, both the first doped region 2 and the second doped region 3 are partially overlapped by the floating gate layer 5. The first doped region 2 is bounded in the direction of the second doped region 3 by a plane which contains the first structure edge 9 of the control gate layer 7. In this exemplary embodiment, the second doped region 3 is bounded in the direction of the first doped region 2 by a plane which contains the second structure edge 10 of the control gate layer 7.

It should be noted that the control gate layer 7 does not necessarily have to be disposed without any overlap over one or both of the doped regions 2, 3. A slight overlap of the control gate layer 7 and one or both of the doped regions 2, 3 is usually unavoidable, since the doped regions 2, 3 expand slightly due to thermal processes during the production method.

An exemplary embodiment of the production of a memory cell according to the invention is explained below with reference to various production steps in connection with FIGS. 3 to 7.

Figure 3:
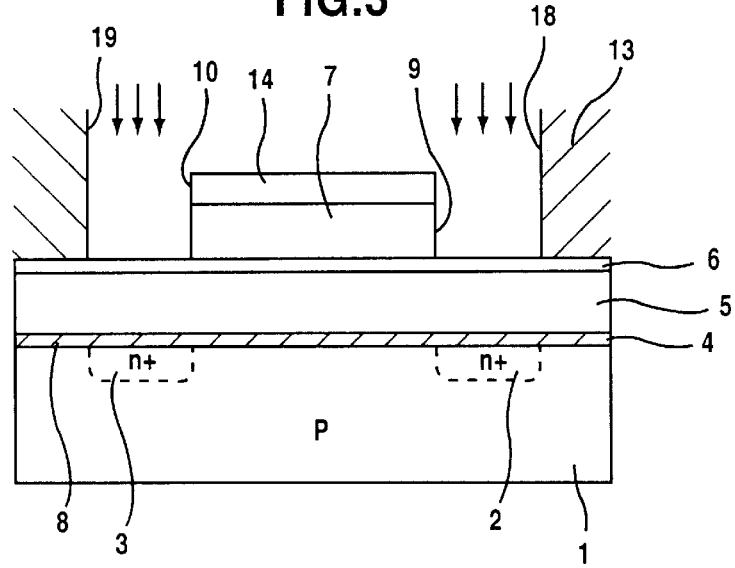
FIGS. 3–7 are cross-sectional views of the memory cell during different method steps.

FIG. 3 illustrates a memory cell during a first method step of the production method according to the invention. A photomask 13 is used to dope the two doped regions 2, 3 into the first main surface 8 of the semiconducting base body 1, to which the oxide layer 4, the floating gate layer 5 and the dielectric 6 have already been applied over the whole surface and to which the control gate layer 7 and a covering layer 14 have already been applied in a structured manner. The doping through the use of ion implantation is carried out in such a way that the dopant passes through the floating gate layer 5 to the first main surface 8 of the base body, the photomask 13 and the control gate layer 7, with the covering layer 14 applied, protecting those regions of the main surface 8 in which no doping is intended to be carried out. In this case the first doped region 2 is bounded in the direction of the second doped region 3 by a plane containing the first structure edge 9 of the control gate layer 7. In the opposite direction, the first doped region 2 is bounded by a plane containing a first structure edge 18 of the photomask 13. The second doped region 3 is bounded in the direction of the first doped region 2 by a plane containing a second structure edge 19 of the photomask 13. In the opposite direction, the second doped region 3 is bounded by a plane containing the second structure edge 10 of the control gate layer 7. A field oxide can also bound the doped regions 2, 3 instead of the structure edges 18 and 19.

Figure 4:
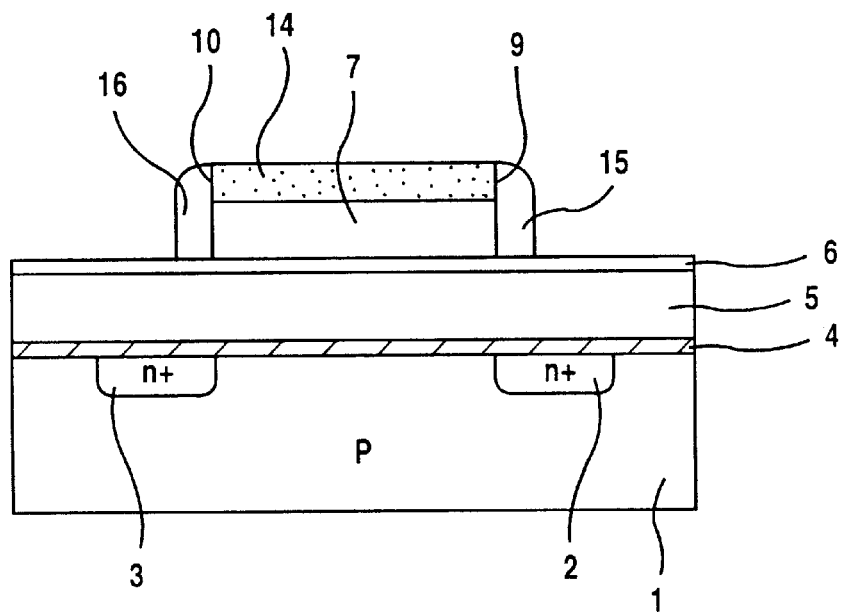

The structure illustrated in FIG. 4 is produced after removal of the photomask 13, production of a first spacer 15 on the first structure edge 9 of the control gate layer 7 and production of a second spacer 16 on the second structure edge 10 of the control gate layer 7. The two spacers 15, 16 can be produced, for example, by isotropic deposition and anisotropic etching back. In a following method step, using a photomask 17, as is illustrated in FIG. 5, it is possible to remove one of the two spacers 15, 16, which is the second spacer 16 in the case illustrated, with the result that a structure which is illustrated in FIG. 6 is produced for the memory cell.

Figure 7:
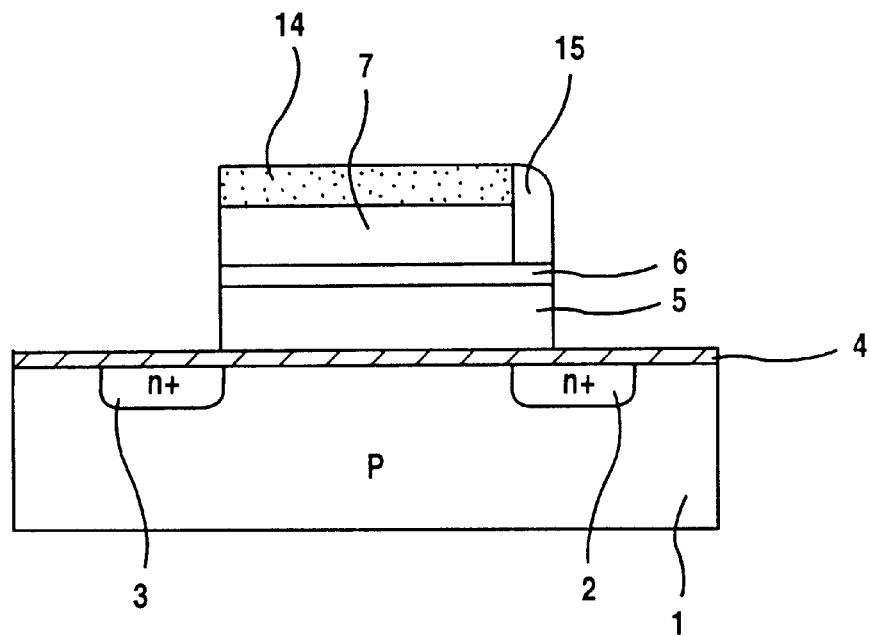

In a further method step, the dielectric 6 is removed, for example by anisotropic etching, in the regions in which it is not covered by the control gate layer 7 and, in the present exemplary embodiment, is not covered by the spacer 15. At the same time, the covering layer 14 may also be thinned, but must not be completely removed. A structure which is illustrated in FIG. 7 is produced after removal of the floating gate layer 5 in the regions which are not covered by the control gate layer 7 and the spacer 15.

In a further step of the method for producing the memory cell according to the invention, the covering layer 14 is removed from the control gate layer 7 and the spacer 15 is removed. Subsequently, a metallization for a control gate terminal G can be carried out on the control gate layer 7, a metallization for a drain terminal D can be carried out on the first doped region 2 and a metallization for a source terminal S can be carried out on the second doped region 3. For this purpose, the oxide layer 4 must be removed entirely or partially from the two doped regions 2, 3.

Figure 5:
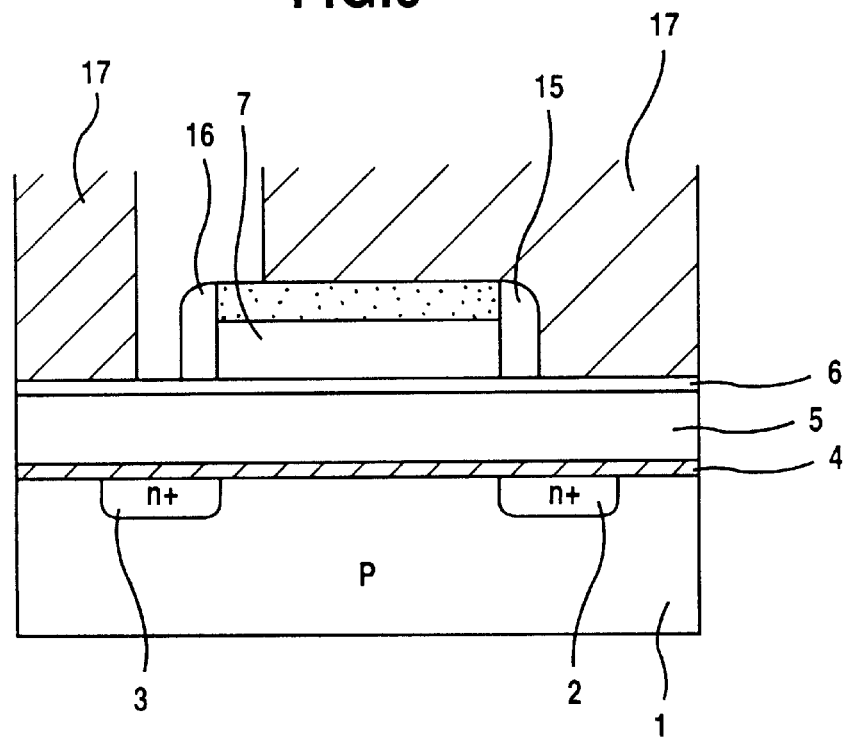
Figure 6:
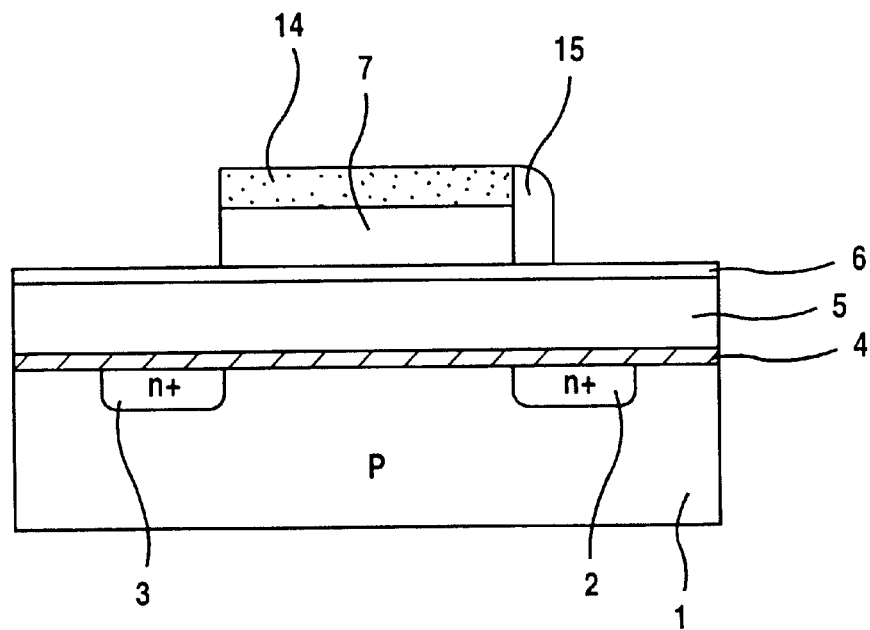

During the method for producing the "symmetrical" memory cell which is illustrated in FIG. 2, the removal of one of the spacers 15, 16 using the photomask 17 in the manner illustrated in FIG. 5 is omitted. The other method steps proceed analogously to the manner which has been described.

I claim:

1. A method for producing a memory cell, which comprises:

a) applying an oxide layer on a main surface of a semiconducting base body;

b) applying a floating gate layer on the oxide layer;

c) applying a dielectric on the floating gate layer;

d) applying a control gate layer on the dielectric defining edges of the control gate layer and defining a region of the main surface not covered by the control gate layer;

e) applying a covering layer on the control gate layer;

f) doping two doped regions of a first conduction type into the semiconducting base body using a photomask;

g) removing the photomask;

h) producing two spacers each on a respective one of the edges of the control gate layer;

i) removing the spacer on one of the edges of the control gate layer leaving a remaining spacer and defining a region of the main surface not covered by the remaining spacer;

j) removing the dielectric and the floating gate layer from the regions of the main surface not covered by the control gate layer and not covered by the remaining spacer; and k) removing the remaining spacer.

2. The method for producing a memory cell according to claim 1, which comprises:

overlapping at least one of the doped regions with at least one first partial region of the floating gate layer; and overlapping at least one of the doped regions with at least one second partial region of the control gate layer being smaller than the at least one first partial region.

3. The method for producing a memory cell according to claim 1, which comprises:

defining a given distance between the edges of the control gate layer; and defining edges of the floating gate layer at a distance therebetween less than the given distance.

4. A method for producing a memory cell, which comprises:

a) applying an oxide layer on a main surface of a semiconducting base body;

b) applying a floating gate layer on the oxide layer;

c) applying a dielectric on the floating gate layer;

d) applying a control gate layer on the dielectric defining edges of the control gate layer and defining a region of the main surface not covered by the control gate layer;

e) applying a covering layer on the control gate layer;

f) doping two doped regions of a first conduction type into the semiconducting base body using a photomask;

g) removing the photomask;

h) producing two spacers each on a respective one of the edges of the control gate layer defining a region of the main surface not covered by the spacers;

i) removing the dielectric and the floating gate layer from the regions of the main surface not covered by the control gate layer and not covered by the spacers; and j) removing the spacers.

5. A method for producing a memory cell, which comprises:

a) applying an oxide layer on a main surface of a semiconducting base body;

b) applying a floating gate layer on the oxide layer;

c) applying a dielectric on the floating gate layer;

d) applying a control gate layer on the dielectric defining edges of the control gate layer and defining a region of the main surface not covered by the control gate layer;

e) doping two doped regions of a first conduction type into the semiconducting base body using a photomask;

f) removing the photomask;

g) producing two spacers each on a respective one of the edges of the control gate layer;

h) removing the spacer on one of the edges of the control gate layer leaving a remaining spacer and defining a region of the main surface not covered by the remaining spacer;

i) removing the dielectric and the floating gate layer from the regions of the main surface not covered by the control gate layer and not covered by the remaining spacer; and j) removing the remaining spacer.

* * * * *